United States Patent
Frosien

(10) Patent No.: US 6,720,557 B2
(45) Date of Patent: *Apr. 13, 2004

(54) PARTICLE BEAM APPARATUS

(75) Inventor: Jurgen Frosien, Riemerling (DE)

(73) Assignee: Advantest Corp., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/825,257

(22) Filed: Apr. 3, 2001

(65) Prior Publication Data
US 2001/0048075 A1 Dec. 6, 2001

(30) Foreign Application Priority Data
May 31, 2000 (EP) .............................................. 00111712

(51) Int. Cl.⁷ .............................................. H01J 37/28
(52) U.S. Cl. .................... 250/307; 250/306; 250/310
(58) Field of Search ................... 250/305, 306, 250/307, 310

(56) References Cited

U.S. PATENT DOCUMENTS

| | | | |
|---|---|---|---|
| 3,819,941 A | * 6/1974 | Carrico | 250/281 |
| 4,308,457 A | 12/1981 | Reimer | |
| 4,926,054 A | * 5/1990 | Frosien | 250/396 R |
| 5,444,242 A | * 8/1995 | Larson et al. | 250/305 |
| 5,466,940 A | 11/1995 | Litman et al. | |
| 5,608,218 A | * 3/1997 | Sato et al. | 250/310 |
| 5,644,132 A | 7/1997 | Litman et al. | |
| 5,828,064 A | * 10/1998 | Knowles | 250/310 |
| 6,291,823 B1 | * 9/2001 | Doyle et al. | 250/308 |
| 6,407,387 B1 | * 6/2002 | Frosien et al. | 250/310 |

* cited by examiner

Primary Examiner—John R. Lee
Assistant Examiner—Anthony Quash
(74) Attorney, Agent, or Firm—Muramatsu & Associates

(57) ABSTRACT

A particle beam apparatus includes a source for providing a primary particle beam along a primary beam axis, an objective lens for focussing the primary particle beam onto a specimen so as to release particles therefrom, and a detection system for image generation. The objective lens includes an immersion lens for decelerating the primary particle. The detection system includes a converter with a conversion area to convert the released accelerated particles into secondary particles, an electrode for influencing the converted secondary particles and at least one detector for detecting the converted secondary particles. The detection system is arranged in front of the immersion lens. The converter and the electrode control the converted secondary particles so as to prevent the converted secondary particles released at a specific part of the conversion area from reaching the detector.

20 Claims, 4 Drawing Sheets

PARTICLE BEAM APPARATUS

FIELD OF THE INVENTION

The invention relates to a particle beam apparatus with a source for providing a primary particle beam along a primary beam axis, an objective lens for focussing the primary particle beam onto a specimen and a detection system for image generation.

BACKGROUND OF THE INVENTION

As integrated circuits are fabricated with features of less than 0.1 µm, electron beam imaging has been established as the technology of choice for process development and quality assurance. However, some specimens, especially those containing features having a high aspect ratio, as, for example, contact holes having a diameter of only 0.1 µm and a depth of 1 µm are very difficult to inspect during manufacturing. Such a contact hole has an aspect ratio of 10:1 and, accordingly, it is very difficult to get a signal from the interior of such a feature in order to create an image of the lower part of the high aspect ratio feature.

In the state of the art high resolution objective lenses having electrostatic retarding field lenses or combined electromagnet lenses are applied. Such lenses use higher beam energies in front of the lens and decelerate the primary beam to the lower final energy inside the objective lens. The deceleration of the primary beam is also used for extraction and acceleration of the particles released at the specimen. The released particles are transferred to the detection means inside or in front of the lens for registration and for forming an image of the specimen's surface using the secondary electrons released at the specimen.

A drawback of such an arrangement is the hole in the detector, which is required for the penetration of the primary particle beam. Since scintillation detectors are built from insulating material, this hole has to have a certain size in order to avoid charging. Secondary electrons with starting angles around 90° just meet the detector in its hole area and get lost. For features having a high aspect ratio, the signal electrons carrying the relevant information are exactly those secondary electrons. Consequently, the inner part of those high aspect features can be imaged only with small signal amplitude, which means a poor signal to noise ratio and consequently a limited information.

To overcome this drawback, it has been proposed to apply a beam separator for separating the primary beam and the secondary electron beam. This enables the application of a detector without a hole. The beam separator, however, is an additional component, which introduces aberrations to the primary particle beam and consequently, the system resolution is negatively affected.

It was also suggested to provide a deceleration area in front of the objective lens. In this area the secondary electrons are so slow that they easily can be gathered. This also enables the detection of the "on-axis" secondary electrons. This approach, however, requires an additional lens which generates an additional crossover in the beam path which increases the energy width of the primary beam and may negatively effect the resolution.

U.S. Pat. No. 5,644,132 discloses a particle beam apparatus for charge-free high resolution imaging and measurement of topographic and material features on a specimen. A particle source provides a primary beam along a primary beam axis, the primary beam impinging on the specimen so as to release electrons therefrom. The electrons includes secondary electrons and backscattered electrons. An objective lens is focusing electrons so as to provide a radial dispersion of the electrons relative to the primary beam axis, the radial dispersion of electrons including an inner annulus of backscattered electrons and an outer annulus of secondary electrons. Furthermore, the apparatus comprises a backscattered electron detector for detecting the inner annulus of backscattered electrons and a secondary electron detector for detecting the outer annulus of secondary electrons. The backscattered electron detector is an electron multiplier.

To reduce the negative influence of the detector hole, the detection of near-axial backscattered electrons is preferably enhanced by forming a flange termination from material which facilitates the generation of secondary electrons by impacting backscattered electrons. These secondary electrons can be additionally detected as described in U.S. Pat. No. 5,466,940.

This known detection system also includes a generally annular electrode for ensuring that the backscattered electron detector detects not only those backscattered electrons which impinge on the active area of the electron multiplier, but also those backscattered electrons which impinge on the inactive area of the electron multiplier and those backscattered electrons which impinge on the flange termination and are converted into secondary particles.

U.S. Pat. No. 5,466,940 further discloses a configuration in which the electron detector is deployed within the optical column. The objective lens of this apparatus comprises an electromagnetic lens which accelerates secondary electrons released from the specimen towards the electron detector.

U.S. Pat. No. 4,308,457 discloses a device for the detection of back-scattered electrons emitted by a specimen in an electron microscope, comprising a converter for converting back-scattered electrons emitted by the specimen into secondary electrons.

SUMMARY OF THE INVENTION

It is an object of the invention to provide a particle beam apparatus according to the present invention having an enhanced contrast information with a simple arrangement.

According to the invention, the particle beam apparatus comprises:
- a source for providing a primary particle beam along a primary beam axis,
- an objective lens for focussing the primary particle beam onto a specimen so as to release particles therefrom and
- a detection system for image generation, the detection system comprises:
  - converter means with a conversion area to convert the released accelerated particles into secondary particles,
  - electrode means for influencing the converted secondary particles, and
  - at least one detector for detecting the converted secondary particles,
  - wherein the objective lens (4) is formed by an immersion lens for decelerating the primary particle beam from a first higher energy to a second final energy before the primary particle beam impinges on the specimen (5) so as to release particles (6) therefrom, the released particles being accelerated by the immersion lens before reaching the detector system (7).

The converter means and the electrode means are adapted to control the converted secondary particles in that a suitable voltage between the converter means and the electrode means prevents converted secondary particles released at a specific part or parts of the conversion area from reaching the detector.

The converter means are preferably formed by a converter plate having at least one opening for the primary particle beam. The converter plate is usually made of conductive material, the opening required for the primary particle beam may be very small, typically less than 500 µm. Therefore, the loss of particles released at the specimen in this region is reduced significantly.

In order to improve the contrast information, it is necessary to differentiate between locations on which the released particles impinge on the converter means or, in other words, to evaluate the signal of those particles that are converted at a specific part or parts of the conversion area. An interesting part of the conversion area may be an inner or outer annular area of the converter means. The different parts of the conversion area may also have the form of annular segments.

In the prior art the contrast information is obtained by using the different detectors. According to the present invention, this information will be obtained in that the converter means and the electrode means are adapted to control the converted secondary particles in that a suitable voltage between the converter means and the electrode means prevents the converted secondary particles released at a specific part or parts of the conversion area from reaching the detector.

BRIEF DESCRIPTION OF THE DRAWINGS

Further embodiments and advantages of the invention will now be described in more detail with reference to the drawings.

DETAILED DESCRIPTION OF THE INVENTION

Figure 1:
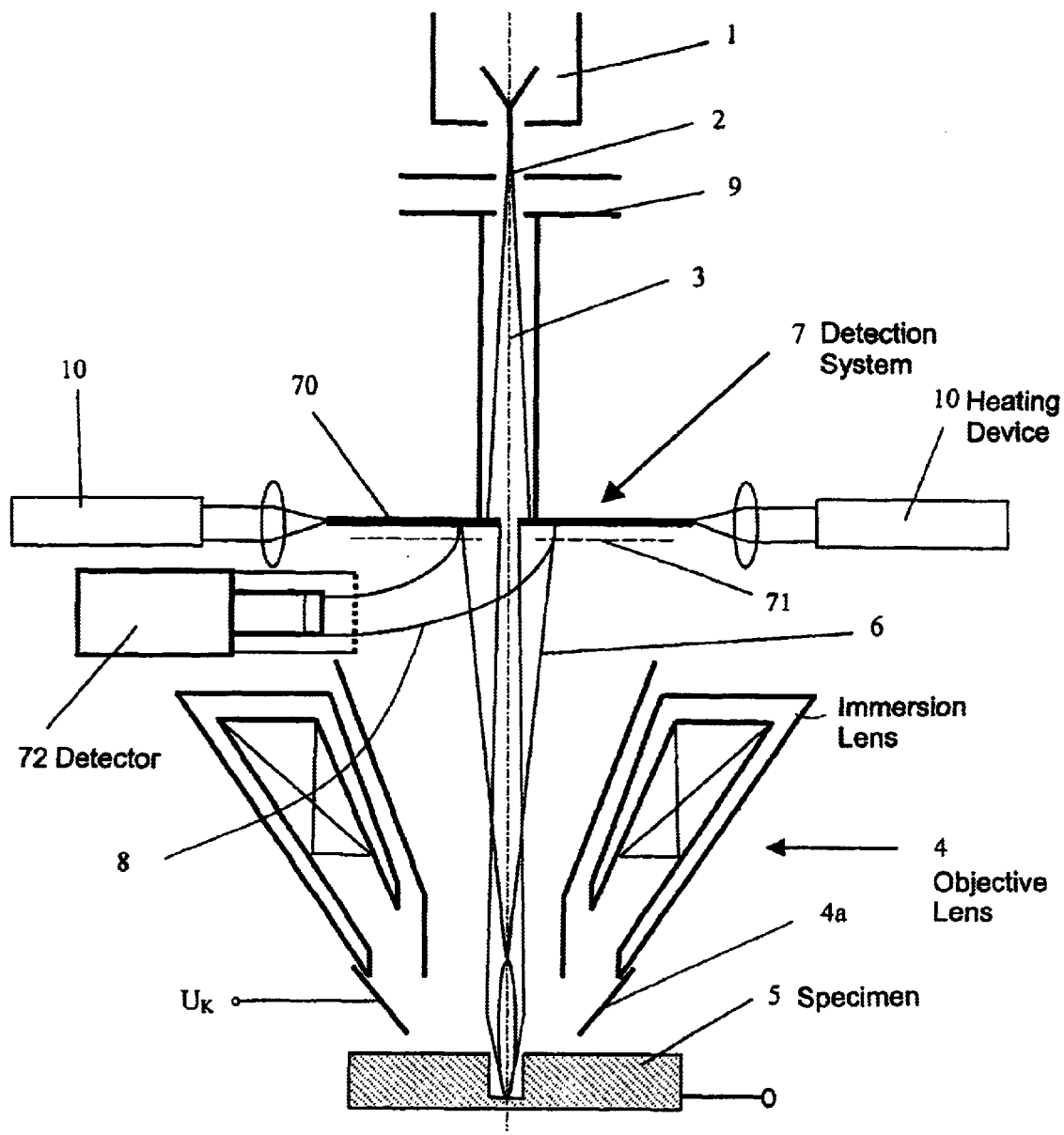
FIG. 1 is a schematic view of a preferred embodiment of the particle beam apparatus.

The particle beam apparatus according to FIG. 1 comprises a source 1 for providing a primary particle beam 2 along a primary beam axis 3, an objective lens 4 for focusing the primary particle beam onto a specimen 5 so as to release particles 6 therefrom and a detection system 7 for detecting said released particles 6.

The detection system 7 comprises converter means 70 with a conversion area to convert the released particles 6 into secondary particles 8, electrode means 71 for influencing the converted secondary particles 8 and at least one detector 72 for detecting the converted secondary particles 8.

The converter means 70 and the electrode means 71 are adapted to control the converted secondary particles 8 in that a suitable voltage between the converter means and the electrode means prevents converted secondary particles 8 released at a specific part or parts of the conversion area from reaching the detector 72. The different embodiments of the detection system 7 will be described below with reference to FIGS. 2 to 8.

The particle beam apparatus further comprises an anode 9 with intermediate acceleration. All other parts of the particle beam apparatus, as further lenses, stigmator, vacuum chamber etc., are not shown for simplicity reason.

The objective lens 4 is preferably formed by an immersion lens for decelerating the primary particle beam 2 from a first high energy to a second final energy before the primary particle beam impinges on the specimen 5 so as to release particles therefrom, the released particles 6 being accelerated by the immersion lens before reaching the detection system. The immersion lens is either an electrostatic or a combined electrostatic-magnetic lens as disclosed in FIG. 1.

However, it is also possible to provide a retarding field for the primary particle beam between the objective lens 4 and the specimen 5.

Source 1 is preferably a field emission gun or a thermal field emission gun having small virtual source size. The converter means 70 are formed by a converter plate having at least one opening for the primary particle beam. The opening is preferably used as a system aperture for the primary particle beam. This ensures that the opening in the converter means 70 has the smallest possible size, which guarantees maximum detection efficiency. The converter means 70 may be realized by an aperture plate having a central hole 70a as disclosed in FIGS. 1 to 6. But it may also be realized by at least one opening being spaced from the optical axis 3.

To avoid contamination by the primary particle beam and/or the released particles 6, which has a negative effect both on the primary particle beam performance and the secondary particle yield of the converter, the converter means 70 and/or a separate beam aperture is heated. FIG. 1 shows two heating devices 10 for the converter means 70 using laser beams. However, any other configuration to increase the temperature may be used.

The released particles 6 are accelerated: by the immersion lens to an energy of several keV (typically between 5 keV and 15 keV). The surface of the converter means 70 should be made of a material having a large secondary particle yield in this energy range. Materials having their second crossover point in their secondary particle yield versus beam energy distribution in this energy range are preferred. Suitable materials are metals having an atomic number of more than 20, as gold, molybdenum and platinum.

Figure 2:
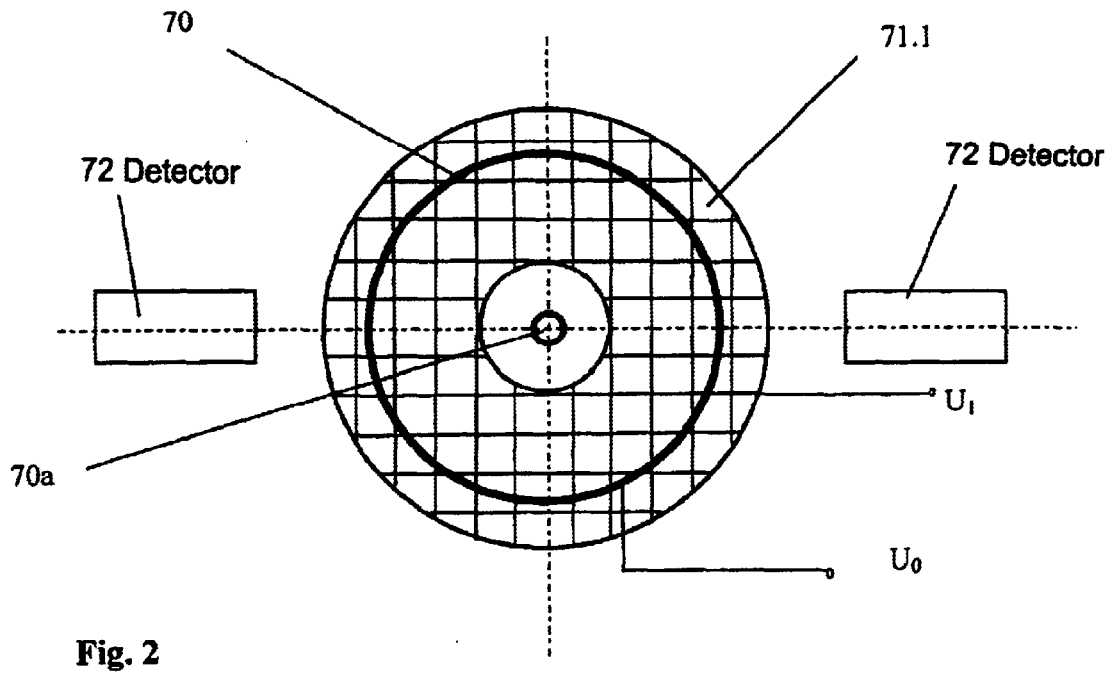
FIG. 2 is a schematic bottom view of a first embodiment of the detection system.

To increase the secondary particle yield, it is preferred that the converter means 70 has a rough surface. FIG. 2 shows a schematic view of the detection system 7 in the direction of the released particles. The converter means 70 is formed by a converter plate having a central hole 70a for the primary particle beam. The electrode means 71 is formed of an annular electrode 71.1 which can be applied with a variable voltage $U_1$. The converter means 70 may also be supplied with a variable voltage $U_0$. The electrode 71.1 is formed by a grid electrode which allows penetration of the released particles to reach the converter means 70. The conversion area of the conversion means 70 comprises a first annular part which is covered by the electrode 71.1 and a second part, a circle around the aperture 70a, which is not covered by the electrode 71.1.

By applying a suitable voltage between the converter means 70 and the electrode 71.1, it will be possible to prevent those converted secondary particles released at the outer annular part of the conversion area (which is covered by the electrode 71.1) from reaching the detector 72. In order to suppress these converted secondary particles, the electrode 71.1 may be applied with a negative voltage $U_1$, while the voltage $U_0$ is zero. If the voltage $U_1$ is positive, all converted secondary particles will be gathered by the positive grid electrode. After penetrating this grid electrode 71.1, the secondary particles 8 are detected by detector 72 which can be a conventional secondary electron detector (e.g. a scintillator/photomultiplier arrangement). By applying a positive or negative voltage to the grid electrode, the contribution of this special part of the converter means 70 which is covered by the grid electrode 71.1 can be controlled. A zero voltage or a positive voltage to the grid electrode 71.1 ensures that all secondary particles starting from the converter means 70 can reach the detector and contribute to the signal. A negative voltage (typically −2 V to −50 V) suppresses the converted secondary electrons and consequently parts of the converter covered by the control electrode means cannot contribute to the detected signal.

In the case that normal surface imaging is performed, the electrode 71.1 is at zero or slightly positive, which means that all converted secondary particles can be detected by the detector means 72. In the case that the inner part of a contact hole shall be imaged, a negative voltage $U_1$ will be applied to the electrode 71.1. Accordingly, only those converted secondary particles will contribute to the detected signals which are converted at the inner part of the converter which is not covered by the electrode 71.1.

Figure 3:
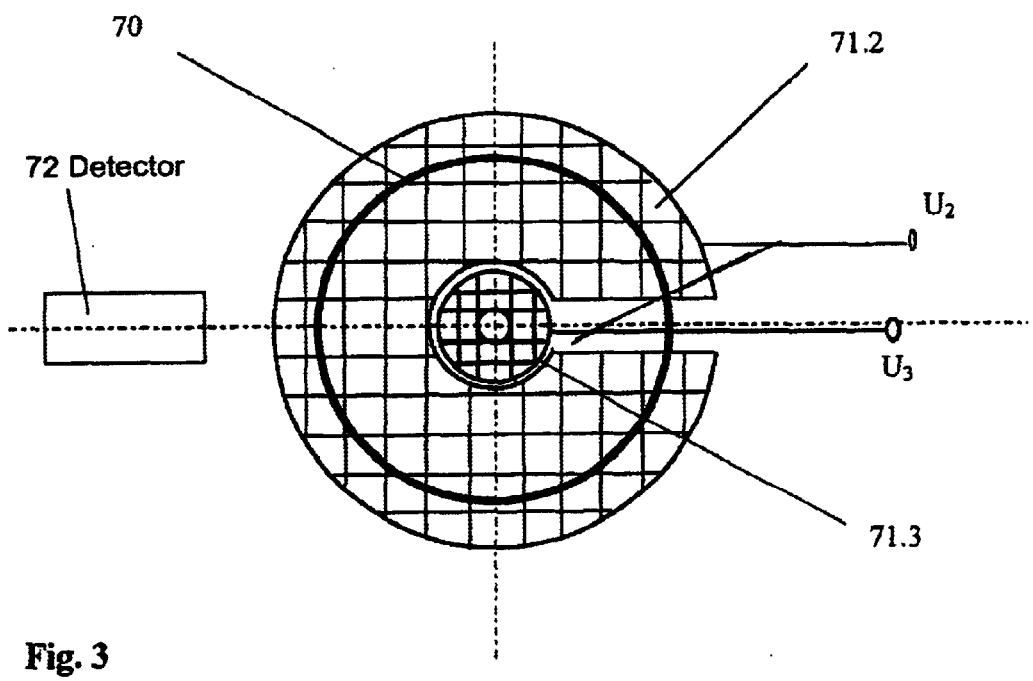
FIG. 3 is a schematic bottom view of a second embodiment of the detection system.

The second embodiment according to FIG. 3 shows electrode means having two electrodes 71.2 and 71.3 which can be applied with variable voltages $U_2$, $U_3$. The inner electrode 71.3 has a circular shape wherein the electrode 71.2 is annular. Both electrodes are arranged concentrically in a plane perpendicular to the primary beam axis 3.

The advantage of the embodiment according to FIG. 3 is the possibility to prevent those converted secondary particles released at the inner circular part which is covered by electrode 71.3 from reaching the detector 72. Accordingly, only those converted secondary particles released at the outer annular part of the conversion area will reach detector 72. Of course, it will also be possible to suppress those converted secondary particles of the outer annular part of the conversion means in order to detect the secondary particles released at the inner circular part.

Figure 4:
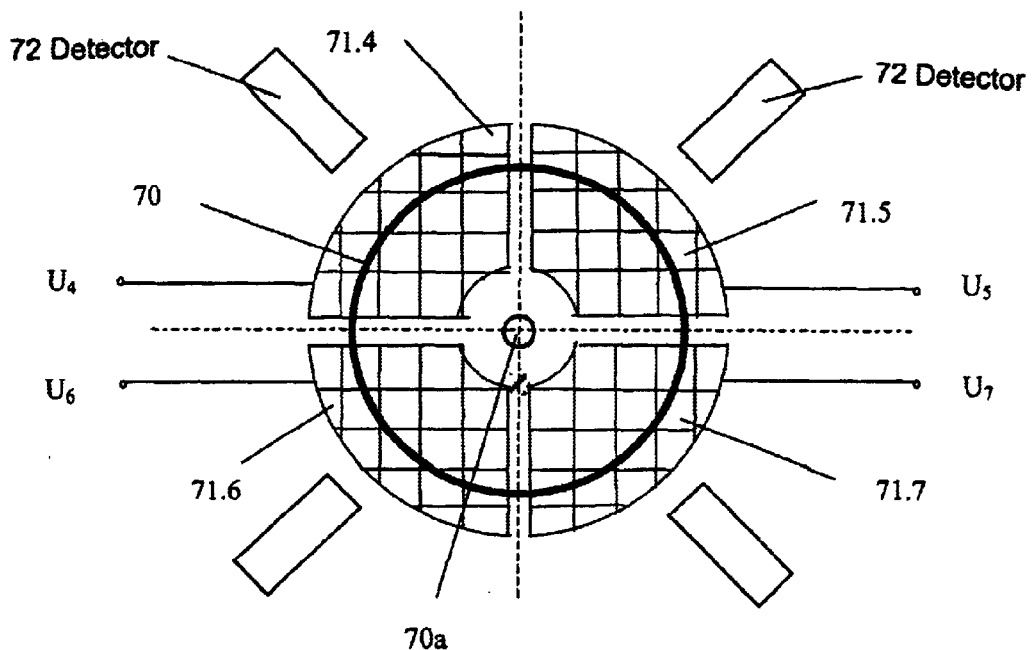
FIG. 4 is a schematic bottom view of a third embodiment of the detection system.

FIG. 4 discloses an embodiment with four angular segmented electrodes 71.4, 71.5, 71.6 and 71.7 which can be applied with variable voltages $U_4$, $U_5$, $U_6$, $U_7$. All angular segments cover the whole conversion area of the conversion means 70 except a circular part around the hole 70a. With such an arrangement, it is possible to get information from converted particles of the inner circle in addition to information of one or more segments.

Depending on the imaging/measuring tasks other arrangements of electrodes are possible, e.g. more than one annular electrode or more or less than four annular segmented electrodes or a combination of both arrangements.

Figure 5A:
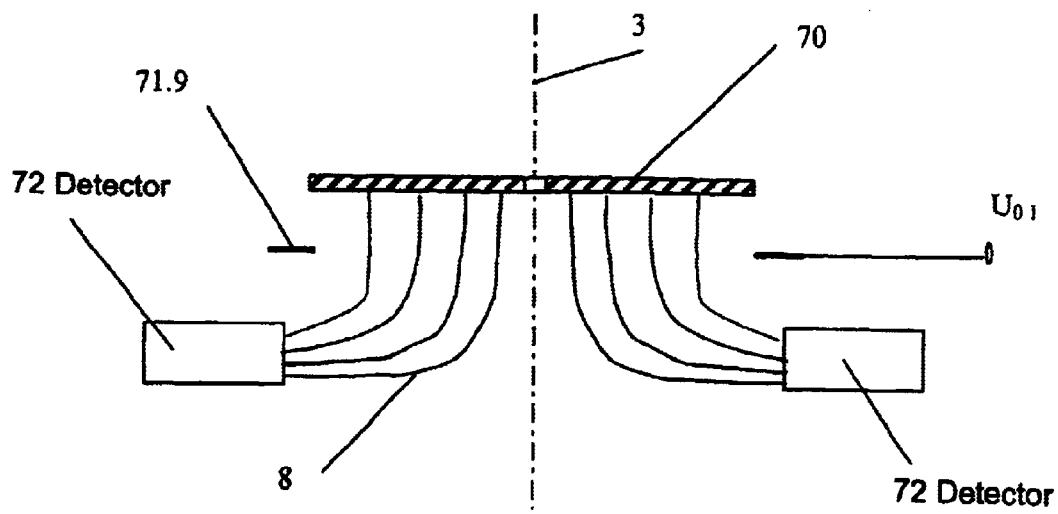
FIGS. 5a–5c schematic side views of a fourth embodiment of the detection system.
Figure 5B:
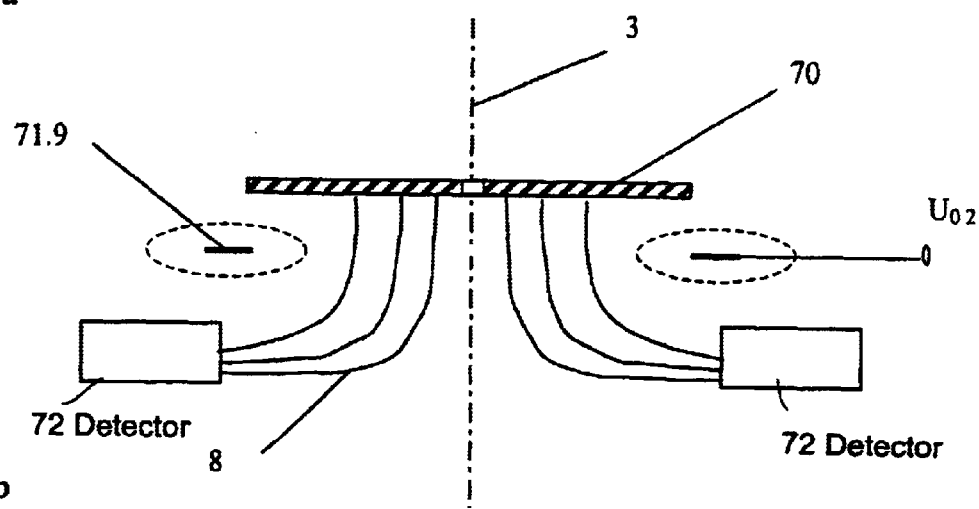
Figure 5C:
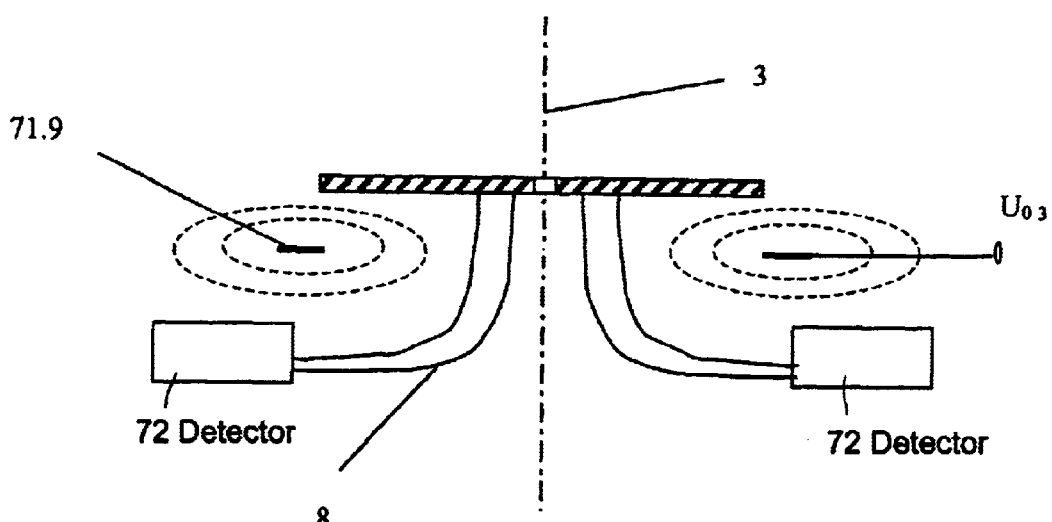

FIGS. 5a–5c show a further embodiment of the detection system, wherein the electrode means are realized by a ring electrode 71.9. This ring electrode can be applied with a variable voltage $U_{01}$, $U_{02}$, $U_{03}$ . . . If voltage $U_{01}=0$, all converted secondary particles 8 will reach the detectors 72. By applying a negative voltage $U_{021}$ it is possible to prevent those secondary particles 8, which are converted at an outer ring of the converter means 70 from reaching the detectors. By applying an even higher negative voltage $U_{03}$ (FIG. 5c) it is possible to suppress all converted secondary particles but those which are released at an inner circle around the optical axis 3. Accordingly, it is possible to vary the conversion area of the converter means 70 smoothly by varying the voltage.

The embodiments according to FIG. 2 and 5 disclose two detectors 72, while the embodiment according to FIG. 3 merely comprises one detector. In FIG. 4, each angular segmented electrode has a corresponding detector 72. However, any other suitable number of detectors can be combined with the disclosed embodiments.

Figure 6:
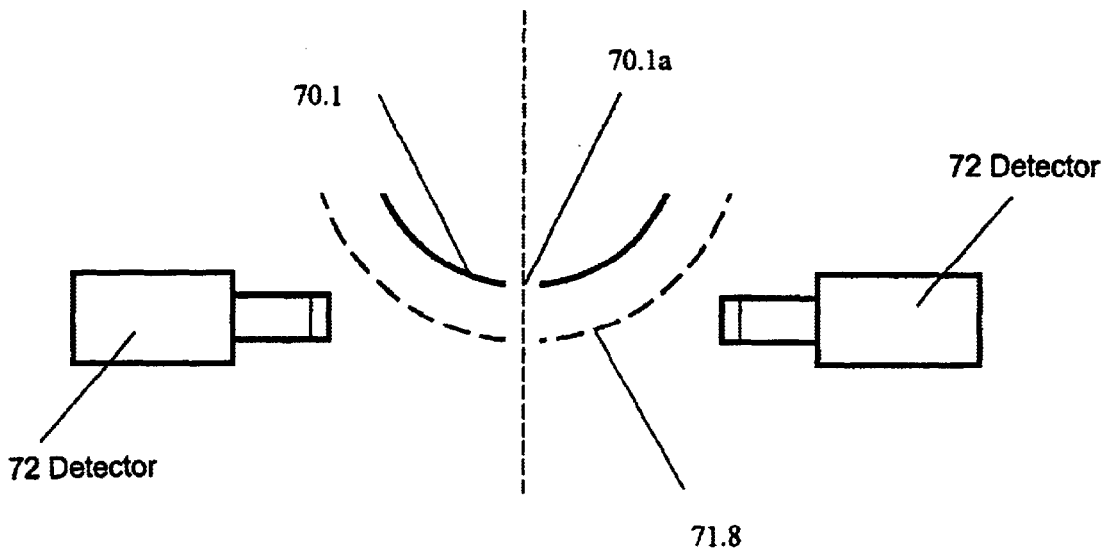
FIG. 6 is a schematic side view of a fifth embodiment of the detection system.

The converter means 70.1 and the control electrode 71.8 according to FIG. 6 are shaped to improve signal detection efficiency. and for shielding the primary particle beam against detector voltage influences. The converter and/or the control electrode may have a spherical, conical or other shapes.

The electrode means 71 are preferably arranged in a distance from the converter means 70 which is less than 10% of the distance between the specimen and the converter means 70.

The objective lens 4 may comprise a control electrode 4a which is arranged at the end of the objective lens in the direction of the primary particle beam 2 (cf. FIG. 1). By applying a suitable negative voltage $U_K$, it is possible to suppress secondary electrons released at the specimen 5. Accordingly, there are merely backscattered electrons which will reach the converter means 70 in order to produce a backscattered electron image.

By applying 0 V or a positive voltage to the control electrode 4a, backscattered electrons as well as secondary electrons released at the specimen 5 will reach the converter means 70. However, as there is a significant higher percentage of secondary electrons, it is possible to receive an image based on secondary electrons released at the specimen 5.

The particle beam apparatus described above with reference to the drawings is a high performance particle beam system with a simple arrangement which avoids complex optical components in the detection system.

What is claimed is:

1. A particle beam apparatus comprising:
   a source for providing a primary particle beam along a primary beam axis;
   an objective lens for focussing the primary particle beam onto a specimen so as to release particles therefrom; and
   a detection system for image generation; said detection system comprising:
   converter means with a conversion area for converting the released particles into secondary particles;
   electrode means for influencing the converted secondary particles; and
   at least one detector for detecting the converted secondary particles;
   wherein the objective lens is formed by an immersion lens for decelerating the primary particle beam from a first higher energy to a second final energy before the primary particle beam impinges on the specimen so as to release particles therefrom, said released particles being accelerated by the immersion lens before reaching the detector system;
   wherein the detection system is arranged in front of the immersion lens, and wherein the converter means and the electrode means are adapted to control the converted secondary particles in such a way that a voltage between the converter means and the electrode means prevents converted secondary particles released at a specific part or parts of the conversion area from reaching the detector.

2. A particle beam apparatus according to claim 1, wherein the converter means and/or electrode means are applied with a variable voltage.

3. A particle beam apparatus according to claim 1, wherein the particles released from the specimen are released secondary electrons.

4. A particle beam apparatus according to claim 1, further comprising a retarding field for the primary particle beam between the objective lens and the specimen.

5. A particle beam apparatus according to claim 1, wherein the converter means is formed by a converter plate having at least one opening for the primary particle beam.

6. A particle beam apparatus according to claim 1, wherein the converter means are formed by a converter plate having at least one opening that is used as a System aperture for the primary particle beam.

7. A particle beam apparatus according to claim 1, wherein the converter means are formed by a converter plate having a central hole that is used as a system aperture for the primary particle beam.

8. A particle beam apparatus according to claim 1, wherein the electrode means has at least two control electrodes that can be applied with variable voltages.

9. A particle beam apparatus according to claim 1, wherein the control electrode means is extending in a plane which is perpendicular to the primary beam axis.

10. A particle beam apparatus according to claim 1, wherein the control electrode means is formed by at least one grid electrode.

11. A particle beam apparatus according to claim 1, wherein the control electrode means is formed by at least one aperture plate electrode that can be applied with a variable voltage.

12. A particle beam apparatus according to claim 1, wherein the control electrode means is formed by a ring electrode.

13. A particle beam apparatus according to claim 1, wherein the converter means are formed by a converter plate arranged perpendicular to the primary beam axis and has at least one opening for the primary particle beam and wherein the control electrode means extend in a plane which is perpendicular to the primary beam axis, wherein the control electrode means covers at least a part of the converter plate in the direction of the released particles.

14. A particle beam apparatus according to claim 1, wherein the control electrode means are formed of at least one annular electrode.

15. A particle beam apparatus according to claim 1, wherein the control electrode means are formed by several angular segmented electrodes.

16. A particle beam apparatus according to claim 1, wherein the control electrode means are arranged in a distance from the converter means which is less than 10% of the distance between the specimen and the converter means.

17. A particle beam apparatus according to claim 1, further including a heating device for heating the converter means.

18. A particle beam apparatus according to claim 1, wherein the converter means has a rough surface.

19. A particle beam apparatus according to claim 1, wherein the surface of the converter means is made of a material having an atomic number of more than twenty.

20. A particle beam apparatus according to claim 1, further including a control electrode arranged between the specimen and the objective lens that can be applied with a voltage in order to suppress secondary electrons released at the specimen to produce a backscattered electron image.

* * * * *